(12) United States Patent
Akagawa et al.

(10) Patent No.: US 7,326,639 B2
(45) Date of Patent: Feb. 5, 2008

(54) METHOD FOR MANUFACTURING A SEMICONDUCTOR SUBSTRATE AND METHOD FOR MANUFACTURING AN ELECTRO-OPTICAL DEVICE WITH ELECTROLESS PLATING

(75) Inventors: Suguru Akagawa, Nagano (JP); Tsuyoshi Yoda, Nagano (JP)

(73) Assignee: Seiko Epson Corporation (JP)

( * ) Notice: Subject to any disclaimer, the term of this patent is extended or adjusted under 35 U.S.C. 154(b) by 371 days.

(21) Appl. No.: 11/102,903

(22) Filed: Apr. 8, 2005

(65) Prior Publication Data

US 2005/0250306 A1    Nov. 10, 2005

(30) Foreign Application Priority Data

Apr. 22, 2004  (JP) ............................. 2004-126965

(51) Int. Cl.
*H01L 21/44*     (2006.01)
*G02F 1/1337*   (2006.01)

(52) U.S. Cl. ...................... 438/616; 349/123
(58) Field of Classification Search ............... 349/123, 349/124, 191; 438/616
See application file for complete search history.

(56) References Cited

U.S. PATENT DOCUMENTS

| | | | | |
|---|---|---|---|---|
| 4,391,491 A | * | 7/1983 | Freer et al. | 349/122 |
| 6,127,199 A | * | 10/2000 | Inoue et al. | 438/30 |
| 7,101,729 B2 | | 9/2006 | Kimura et al. | |
| 7,180,093 B2 | * | 2/2007 | Takayama et al. | 257/59 |
| 7,214,555 B2 | * | 5/2007 | Yamazaki et al. | 438/30 |

FOREIGN PATENT DOCUMENTS

| | | |
|---|---|---|
| JP | 01-140652 | 6/1989 |
| JP | 04-350951 | 12/1992 |
| JP | 07-86340 | 3/1995 |
| JP | 2003-031778 | 1/2003 |
| JP | 2003-098977 | 4/2003 |
| JP | 2003-347524 | 12/2003 |
| JP | 2004-031669 | 1/2004 |

* cited by examiner

*Primary Examiner*—David W. Coleman
(74) *Attorney, Agent, or Firm*—Harness, Dickey & Pierce, P.L.C.

(57) ABSTRACT

A method is provided including, after joining a wiring substrate and an element substrate, separating a second substrate of the element substrate from a semiconductor element, and electrically coupling an element-side terminal that has been exposed by the separation to a wiring-side terminal disposed outside the semiconductor element by electroless plating.

9 Claims, 8 Drawing Sheets

METHOD FOR MANUFACTURING A SEMICONDUCTOR SUBSTRATE AND METHOD FOR MANUFACTURING AN ELECTRO-OPTICAL DEVICE WITH ELECTROLESS PLATING

RELATED APPLICATIONS

This application claims priority to Japanese Patent Application No. 2004-126965 filed Apr. 22, 2004 which is hereby expressly incorporated by reference herein in its entirety.

BACKGROUND

1. Technical Field

The present invention relates to a method for manufacturing a semiconductor substrate and a method for manufacturing an electro-optical device.

2. Related Art

Electro-optical devices such as liquid crystal devices and organic electroluminescent (hereinafter called "EL") devices that include a structure provided with semiconductor elements such as thin-film transistors (hereinafter called "TFT") on a substrate are generally known. In most cases, manufacturing the semiconductor substrate fitted with such semiconductor elements requires high-temperature processing. Accordingly, forming an electro-optical device including the semiconductor elements on the substrate can deform the substrate by heat, damage peripheral circuit elements, and lower product life. As a result, characteristics of the electro-optical device can be reduced.

In recent years, transfer methods for manufacturing electro-optical devices have been proposed that employ a conventional semiconductor manufacturing technology including high-temperature processing in order to provide semiconductor elements such as TFT on a heat-resisting base substrate, then separate an element-forming film (layer) fitted with the TFT from the base substrate, and then join the film on a wiring substrate have been disclosed (see Japanese Unexamined Patent Publication No. 2003-031778, for example). Using this transfer technology allows semiconductor elements to be provided on, for example, a plastic substrate that has relatively low heat resistance. Consequently, it is possible to enhance the design versatility of such electro-optical devices and avoid exposing peripheral circuit elements to high-temperature processing, and thereby reducing heat deformation of the substrate and damage of the circuit elements and providing desirable electro-optical devices.

According to Japanese Unexamined Patent Publication No. 2003-031778, conductive particles are printed and arranged on a bump formed on a wiring substrate, and a TFT substrate is further transferred thereto with a curing resin therebetween. Then the wiring substrate and TFT are joined by heat and pressure. This transfer technology, however, can cause an open defect with poor conductivity of the TFT in joining the wiring substrate and TFT because of inaccurate bump heights, inaccurate printing of the conductive particles (printing amount, shape, alignment), substrate bending caused by transferring under heat and pressure, poor trapping of the conductive particles, and so forth. In addition, transferring under more heat and pressure in order to avoid such an open defect can damage the TFT.

Taking the above problems into account, the present invention aims to provide a method for manufacturing a semiconductor substrate that ensures conductivity between an element and wiring substrate without damaging the element, and also provide a method for manufacturing an electro-optical device.

SUMMARY

In order to address the problems, a method for manufacturing a semiconductor substrate having a semiconductor element mounted on a wiring substrate according to one aspect of the present invention includes the following: forming the wiring substrate including a wiring-side terminal on a surface of a first substrate; forming an element substrate by providing the semiconductor element including an element-side terminal to a second substrate so as to dispose the element-side terminal face to face with a surface of the second substrate; joining the wiring substrate with the element substrate by disposing the surface of the first substrate on which the wiring-side terminal is provided face to face with the surface of the second substrate on which the semiconductor element is provided in a way that the wiring-side terminal is disposed outside the semiconductor element in a substrate plane; separating the second substrate from the semiconductor element after joining the wiring substrate with the element substrate; and electrically coupling the element-side terminal that has been exposed by separating the second substrate to the wiring-side terminal disposed outside the semiconductor element by electroless plating.

According to this manufacturing method, after the semiconductor element is transferred to the wiring substrate in a way that the wiring-side terminal faces upwardly (toward the surface for joining) and the element-side terminal faces upwardly (opposite to the surface for joining), the wiring-side terminal and the element-side terminal both facing upwardly are electrically coupled to each other by electroless plating. Accordingly, it is possible to enhance conductivity without causing any defect that damages the elements with more heat and pressure for coupling. Also, since the coupling part between the terminals faces upwardly, it is easy to check the coupling in an appearance test, stylus test, or the like. Moreover, even if contact failure occurs, it is easy to solve the problem since the coupling part faces upwardly.

In the manufacturing method, forming the wiring substrate may include forming a group of terminals composed of a plurality of wiring-side terminals, and joining the wiring substrate with the element substrate may include applying an adhesive to an in-plane area serving as a joining area that is inside the group of terminals so as to join the wiring substrate with the element substrate by means of the adhesive.

This joining method can increase joining strength. Furthermore, since the adhesive is applied to the area inside the group of terminals composed of the wiring-side terminals, it is possible to prevent or restrain the wiring-side terminals from being coated with the adhesive, and thereby maintaining desirable conductivity to the element-side terminal. Here, the area inside the group of terminals composed of the wiring-side terminals means an area with which the element substrate is joined, or an area serving as a joining surface with the element substrate. More specifically, the group of terminals composed of the plurality of wiring-side terminals is arranged circularly, and the adhesive may be applied to the inside of the circular arrangement, which serves as the joining area.

In the manufacturing method, electrically coupling the terminals to each other may be conducted by making plating grow from both terminals. This method can reduce processing time for the coupling. It is also possible to enhance conductivity of both terminals since they are electrically coupled to each other with plating that have grown from both the wiring-side terminal and the element-side terminal.

The manufacturing method may also include, before electrically coupling the terminals to each other, providing an insulating wall outside the wiring-side terminal disposed around the semiconductor element so as to restrain plating from extending outward. By providing the insulating wall, it is possible to sufficiently deposit plating, and thereby further enhancing conductivity. Even if the gap between the wiring-side terminal and the element-side terminal is not exactly as planned (i.e. a transferred point is out of alignment), for example, it is possible to ensure desirable conductivity.

In order to address the problems, a method for manufacturing an electro-optical device having a switching element for driving a light-emitting element mounted on a wiring substrate according to another aspect of the present invention includes the above-described method for manufacturing a semiconductor substrate so as to mount the semiconductor element as the switching element on the wiring substrate.

An electro-optical device manufactured by this method is highly reliable with desirable element characteristics.

DETAILED DESCRIPTION

Figure 1:
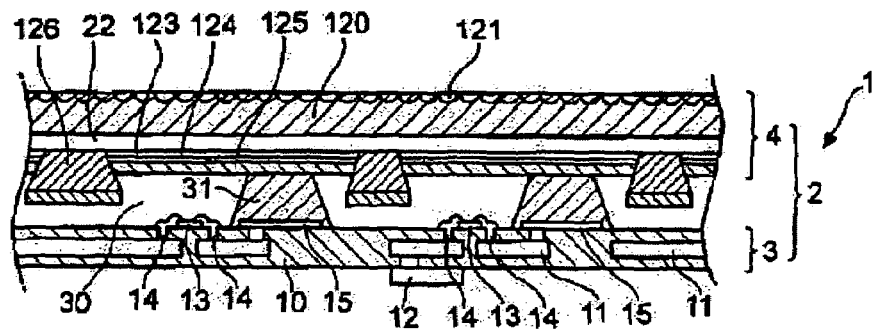
FIG. 1 is a sectional view schematically showing the structure of a semiconductor substrate and electro-optical device.

Preferred embodiments of the present invention will be described with reference to the accompanying drawings. Note that the scale of the members in the drawings referred to herein are enlarged so that they are visible.

Referring to FIG. 1, the structure of an electro-optical device manufactured by a method for manufacturing a semiconductor substrate according to one embodiment of the present invention will now be described. FIG. 1 is a sectional view schematically showing the structure of an electro-optical device 1 at least including a substrate joint 2. The substrate joint 2 has a structure in which a semiconductor substrate 3 and an organic EL substrate 4 are joined.

The semiconductor substrate 3 includes a wiring substrate 10, a wiring pattern 11 of a predetermined shape provided to the wiring substrate 10, a circuit part 12 coupled to the wiring pattern 11, a TFT (semiconductor element) 13 for driving an organic EL element 124 on substrate 4, a TFT coupling part (wiring-side terminal) 14 for electrically coupling the TFT 13 to the wiring pattern 11, and an organic EL coupling part 15 for joining the organic EL element 124 with the wiring pattern 11. The TFT coupling part 14 is formed depending on the terminal pattern of the TFT 13.

The organic EL substrate 4 includes a transparent substrate 120 through which light passes, a light scattering part 121 scattering light, an anode 122 made of a transparent metal material such as indium tin oxide (ITO), a hole injection/transport layer 123, the organic EL element 124, a cathode 125, and a cathode separator 126. Here, the anode 122, the hole injection/transport layer 123, the organic EL element 124, and the cathode 125 are so-called light-emitting elements that provide the organic EL element 124 with holes or electrons to make it emit light. Note that known methods can be used to make up these light-emitting elements. An electron injection/transport layer may also be provided between the organic EL element 124 and the cathode 125.

A portion between the semiconductor substrate 3 and the organic EL substrate 4 is filled with a sealing paste 30. In addition, a conductive paste 31 that provides electrical conductivity between the organic EL coupling part 15 and the cathode 125 is provided. While the organic EL substrate is used as a light-emitting element substrate in the present embodiment, this is not intended to limit the present invention. A light-emitting element substrate having a solid-state light-emitting element such as a light emitting diode (LED can be used instead.

A method for manufacturing the electro-optical device 1 shown in FIG. 1 will now be described.

A method for manufacturing the electro-optical device 1 according to the present embodiment mainly includes processes for manufacturing the semiconductor substrate 3, manufacturing the organic EL substrate 4, and joining the semiconductor substrate 3 and the organic EL substrate 4. Each process will now be described. The present embodiment has an advantage in the process for manufacturing the semiconductor substrate 3 in particular.

The process for manufacturing the semiconductor substrate 3 employs a method for transferring the TFT 13 that is a semiconductor element to the wiring substrate 10 so as to provide the semiconductor element. More specifically, the semiconductor substrate 3 is manufactured by joining a substrate (element substrate) having the TFT 13 with the wiring substrate 10 having the TFT coupling part 14 and then transferring the TFT 13 to the wiring substrate 10. Now, the steps for manufacturing the wiring substrate 10 and an element substrate 20 (referring to FIG. 3) will be described herein, followed by steps for joining the wiring substrate 10 and the element substrate 20, transferring the TFT 13, and so forth.

Figure 2A:
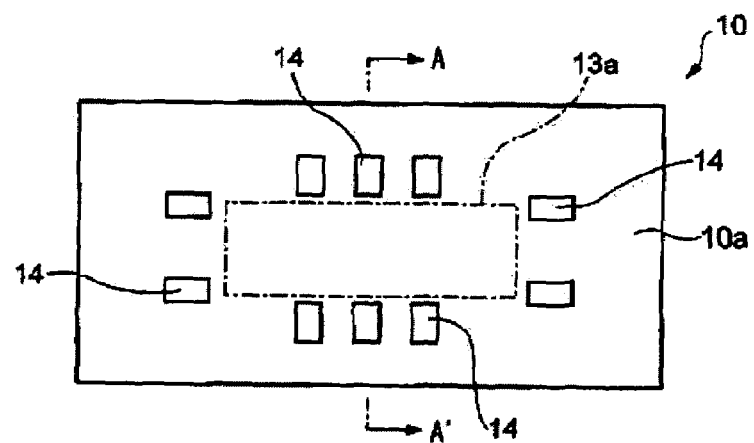
FIG. 2A is a plan view and FIG. 2B is a sectional view schematically showing the structure of the semiconductor substrate.
Figure 2B:
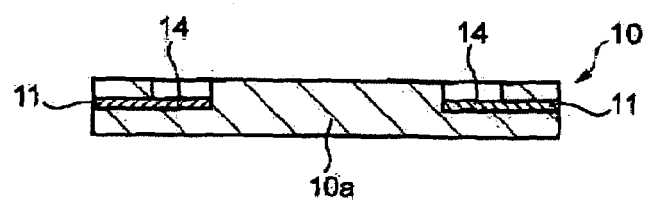
Figure 3A:
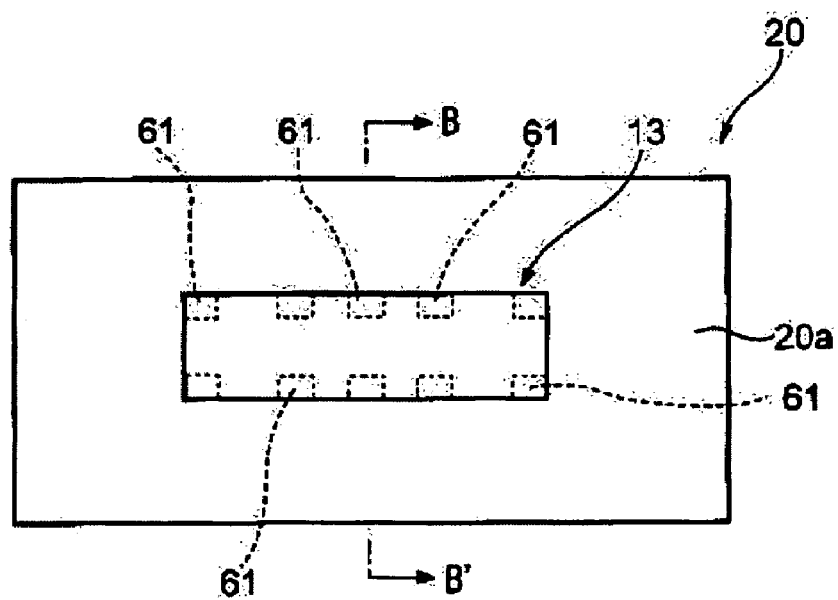
FIG. 3A is a plan view and FIG. 3B is a sectional view schematically showing the structure of an element substrate.
Figure 3B:
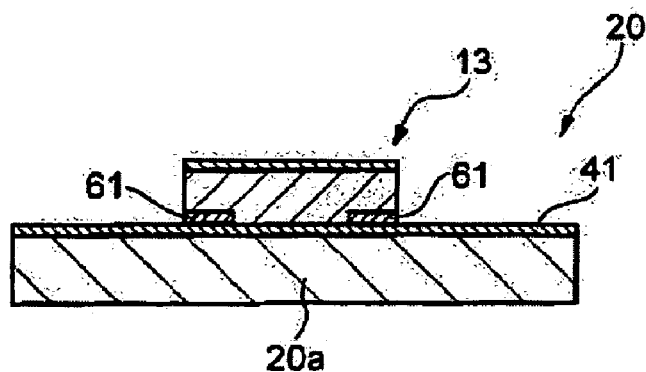

FIG. 2A is a plan view showing the structure of the wiring substrate 10, and FIG. 2B is a sectional view along line A-A'. FIG. 3A is a plan view showing the structure of the element substrate 20, and FIG. 3B is a sectional view along line B-B'. FIGS. 4 and 5 are sectional views showing steps for joining the substrates 10 and 20 and transferring the TFT 13. FIGS. 6 and 7 are plan views showing the steps for joining and transferring shown in FIGS. 4 and 5.

A step for manufacturing the wiring substrate 10 shown in FIG. 2 will now be described.

First, a glass substrate (first substrate) 10a is prepared. The glass substrate 10a is preferably a translucent heat-resisting substrate made of quartz glass, soda glass, or the like. On the surface of the glass substrate 10a, a silicon oxide film (not shown) is provided by chemical vapor deposition (CVD). Subsequently, the wiring pattern 11 is provided on the silicon oxide film.

Subsequently, a resin insulating film (not shown) is provided on the wiring pattern 11. Then part of the resin insulating film is removed so as to form an opening that partially exposes the wiring pattern 11. The opening serves as the TFT coupling part 14. This way the wiring substrate 10 shown in FIG. 2 is formed.

The TFT coupling part 14 is formed in a predetermined pattern. More specifically, a plurality of TFT coupling parts each corresponding to the TFT coupling part 14 form a group of coupling parts (terminals) in a rectangular ring on a plane surface as shown in FIG. 2A. Provided inside the group of coupling parts is a joining area 13a.

Here, ten TFT coupling parts 14 are formed for each chip (TFT 13) and are arranged in 5×2 lines as shown in FIG. 2. The dimensions of each TFT coupling part 14 are (5 to 30 µm)×(5 to 30 µm). The gap between two adjacent TFT coupling parts 14 is 10 to 25 µm wide.

A step for manufacturing the element substrate 20 shown in FIG. 3 will now be described.

First, a glass substrate (second substrate) 20a is prepared. The glass substrate 20a is preferably a translucent heat-resisting substrate made of quartz glass, soda glass, or the like. The TFT 13 is provided on the surface of the glass substrate 20a. In manufacturing the TFT 13, a known technique including high-temperature processing can be used, and therefore its detailed description is omitted here. Here, the TFT 13 is so formed by a known high-temperature processing technique so that a coupling terminal 61 of the TFT 13 is placed directly on the glass substrate 20a. In other words, the coupling terminal 61 of the TFT 13 faces the surface of the glass substrate 20a.

Provided on the surface of the glass substrate 20a on which the TFT 13 is provided is a separating layer 41. The separating layer 41 is made of a material inside or on the boundary of which separation (also referred to as "interlayer separation" or "boundary separation") takes place when irradiated with laser light. More specifically, when irradiated with laser light of a certain light intensity, the interatomic or intermolecular bonding force of atoms or molecules composing the substance is reduced or obliterated, and thereby the resulting ablation causes such separation. Here, components contained in the separating layer 41 are released as a gas in some cases, and thereby the separation takes place. In other cases, the separating layer 41 absorbs light, turning its components to gas, and thereby the gas evaporates, which causes the separation.

The separating layer 41 is composed of amorphous silicon (a-Si) here. The amorphous silicon may contain hydrogen (H). Hydrogen is preferably contained since hydrogen released by light irradiation develops inner pressure in the separating layer 41, which promotes the separation. In this case, the content of hydrogen is preferably about 2 at % or more, and more preferably, from 2 to 20 at %. The content of hydrogen is adjusted by appropriately setting deposition conditions, such as gas composition, gas pressure, gas atmosphere, gas flow, gas temperature, substrate temperature, and applied power when employing CVD. Other examples of materials of the separating layer include silicon oxide, silicate compound, silicon nitride, aluminum nitride, titanium nitride and other nitride ceramics, organic polymer materials whose interatomic bonds are broken when irradiated with light, metal materials such as Al, Li, Ti, Mn, In, Sn, Y, La, Ce, Nd, Pr, Gd, and Sm, and alloys containing at least one of the metal materials.

The thickness of the separating layer 41 is preferably about 1 nm to 20 µm, more preferably about 10 nm to 2 µm, and further preferably about 20 nm to 1 µm. If the separating layer 41 is too thin, it cannot be formed evenly, which results in uneven separation on one hand. On the other, if the separating layer 41 is too thick, the separation requires intensive (or a large amount of) irradiation light. Moreover, it takes time to remove the residue of the separating layer 41 after the separation.

The separating layer 41 can be formed by any methods that are capable of forming the separating layer 41 to an even thickness. An appropriate method is selected depending on various conditions such as the composition or thickness of the separating layer 41. Examples of such methods include CVD (such as MOCCVD, low-pressure CVD, ECR-CVD), vapor deposition, molecular beam deposition (MB), sputtering, ion doping, PVD and other vapor deposition methods; electroplating, dipping, electroless plating and other plating methods; Langmuir Blodgett (LB), spin coating, spray coating, roll coating and other coating methods; printing methods, transferring methods, ink jetting, and powder jetting. Moreover, two or more of the above-mentioned methods can be used in combination.

In particular if the separating layer 41 is composed of amorphous silicon (a-Si), CVD, particularly low-pressure CVD and plasma CVD can be preferably used for deposition. If the separating layer 41 is deposited with ceramics by a sol-gel method, or with an organic polymer material, a coating method, in particular spin coating can be preferably used for deposition.

Figure 4A:
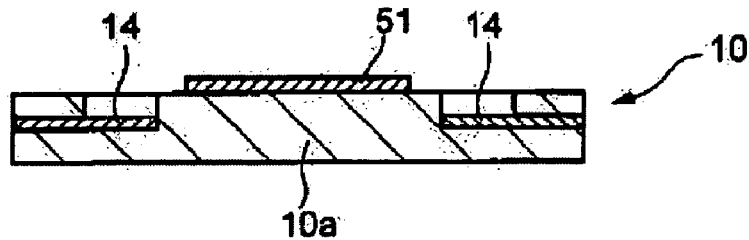
FIGS. 4(A-C) comprise sectional views illustrating processes for manufacturing the semiconductor substrate according to one embodiment of the present invention.
Figure 6A:
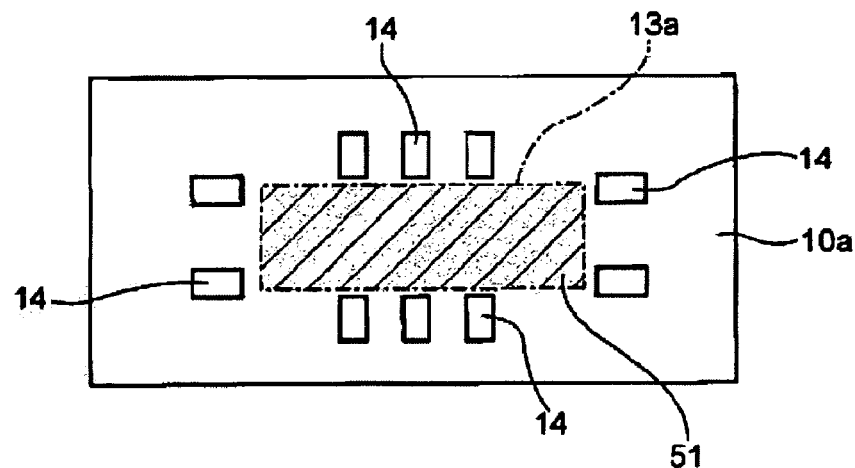
FIGS. 6(A-B) comprise sectional views illustrating processes for manufacturing the semiconductor substrate according to one embodiment of the present invention.

The wiring substrate 10 and the element substrate 20 manufactured as mentioned above will now be joined. As shown in FIGS. 4A and 6A, an adhesive 51 is applied to the inside area (joining area) 13a of the group of coupling parts each corresponding to the TFT coupling part 14 provided on the glass substrate 10a of the wiring substrate 10. To apply the adhesive 51, dispensing, photolithography, and a droplet delivery method with an ink-jet device can be used, for example.

The adhesive 51 is applied away from where the TFT coupling part 14 is provided on the glass substrate 10a. More specifically, the adhesive 51 is applied not to spread to reach the TFT coupling part 14 when joining the TFT 13 as described later. Furthermore, the adhesive 51 is applied in such an amount that it does not spread to reach the TFT coupling part 14.

Here, the adhesive 51 may also be applied to the element substrate 20, or to both the wiring substrate 10 and the element substrate 20. Also, the adhesive 51 may be applied in the shapes of squares or circles on a plane surface, or as scattered dots and lines. Examples of the adhesive 51 can include a thermoplastic or photocuring resin material. The adhesive 51 can contain fillers or particles.

Figure 4B:
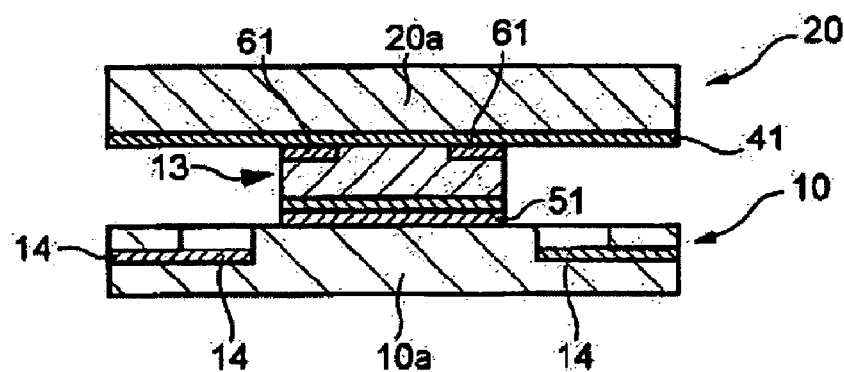
Figure 6B:
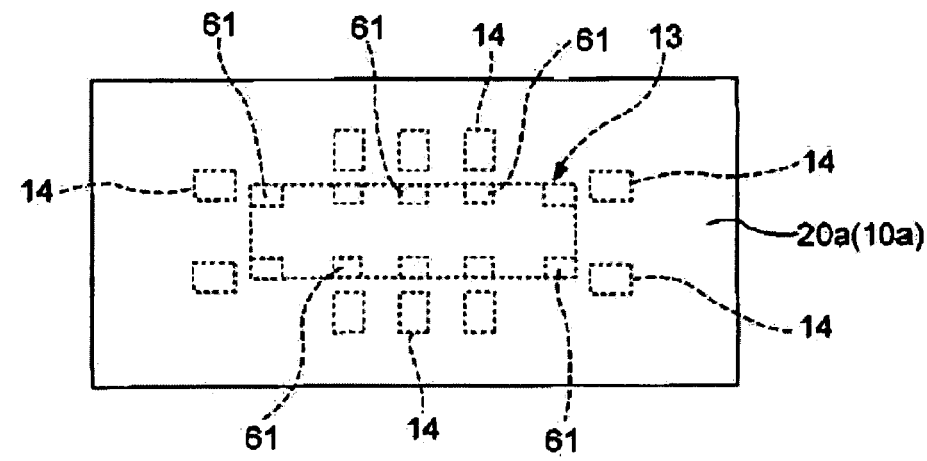

The wiring substrate 10 and the element substrate 20 are then joined with the adhesive 51 that has been applied. More specifically, the substrates 10 and 20 are joined with the surface of the glass substrate 10a on the wiring substrate 10 side on which the TFT coupling part 14 is provided facing the surface of the glass substrate 20a on which TFT 13 and the coupling terminal 61 are provided as shown in FIGS. 4B and 6B. In such manner the TFT 13 comes in contact with the surface of the wiring substrate 10. Furthermore, they are joined in a way that the TFT coupling part 14 is placed outside the TFT 13 in the substrate plane in particular. In other words, the TFT 13 is placed inside the joining area 13*a* with the coupling parts lying radially outwardly from the TFT 13.

Figure 4C:
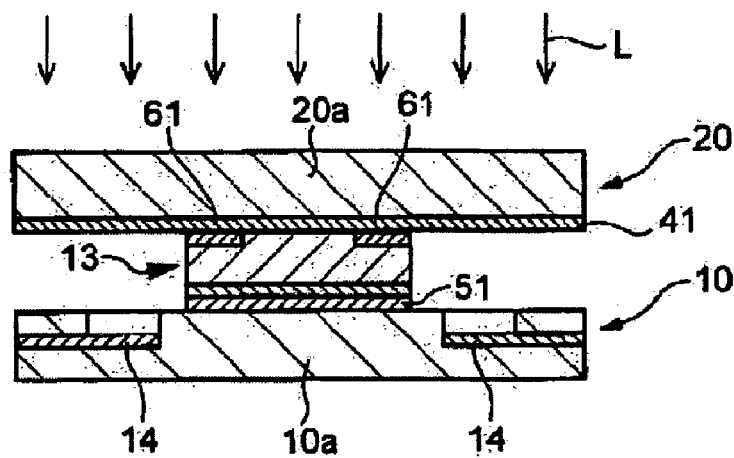

The glass substrate 20 is separated so as to transfer the TFT 13 from the glass substrate 20*a* side to the glass substrate 10*a* (wiring substrate 10) side. More specifically, the back side of the glass substrate 20*a* (the side opposite to the other side having the TFT 13 of the element substrate 20) is irradiated with laser light L as shown in FIG. 4C. Consequently, the interatomic and intermolecular bonding forces of the separating layer 41 are weakened, and thereby hydrogen contained the separating layer 41 becomes molecules to be separated from crystal bonding. In other words, the bonding force of the layer 41 is sufficiently weakened by the laser light so that it becomes easy to removed the glass substrate 20 leaving behind the TFT 13 on the wiring substrate 10.

Figure 5A:
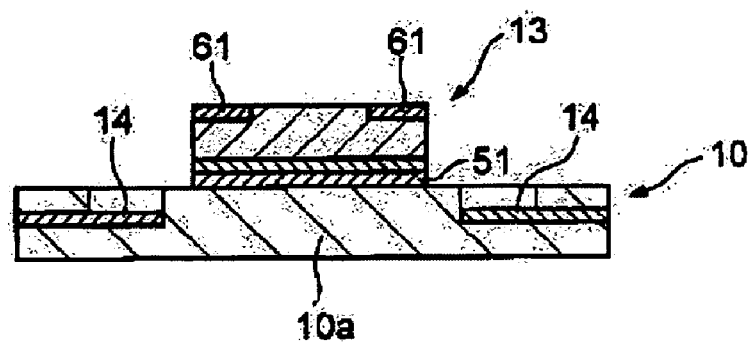
FIGS. 5(A-B) comprise sectional views illustrating processes for manufacturing the semiconductor substrate according to one embodiment of the present invention.
Figure 7A:
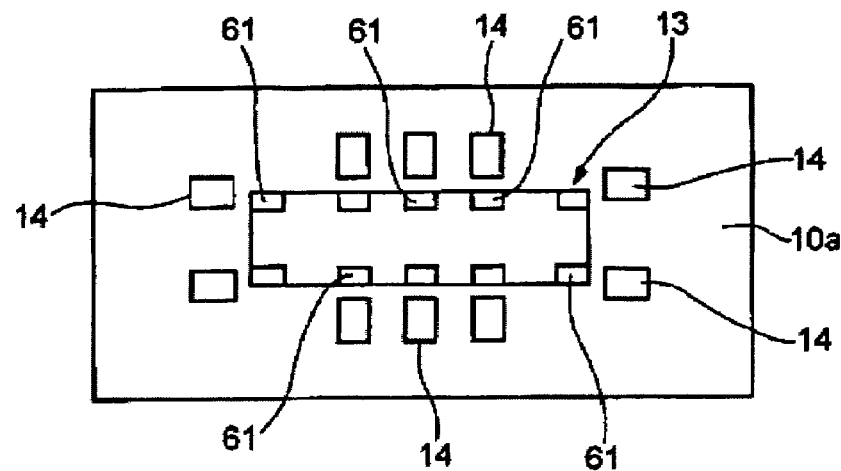
FIGS. 7(A-B) comprise sectional views illustrating processes for manufacturing the semiconductor substrate according to one embodiment of the present invention.

By separating the glass substrate 20 from the TFT 13 by the laser light irradiation, the TFT 13 is transferred to the wiring substrate 10 as shown in FIGS. 5A and 7A. As shown in these drawings, the surface of the coupling terminal (TFT coupling part) 14 on the wiring substrate 10 and the surface of the coupling terminal 61 on the element substrate 20 both are oriented upwardly in the same direction.

After the transferring, the coupling terminals 14 and 61 are electrically coupled. Here, electroless plating is employed for coupling the two. First, in order to improve the wettability of the surface of each coupling terminals 14 and 16 and remove a residue thereon, they are immersed in a processing solvent. In the present embodiment, they are immersed in a water solution containing 0.01% to 0.1% hydrofluoric acid and 0.01% to 0.1% sulfuric acid for one to five minutes. Alternatively, they may be immersed in an alkali-based water solution containing 0.1% to 10% sodium hydroxide, for example, for one to ten minutes.

Next, they are immersed in an alkaline water solution (pH 9 to 13) based on sodium hydroxide, heated up to 20 to 60 degrees Celsius, for one second to five minutes in order to remove an oxide film from their surfaces. Alternatively, they may be immersed in an acid water solution (pH 1 to 3) based on 5% to 30% nitric acid, heated up to 20 to 60 degrees Celsius, for one second to five minutes.

Furthermore, they are immersed in a zincate solution (pH 11 to 13) containing ZnO for one second to two minutes in order to replace the surfaces of the terminals with Zn. Subsequently, they are immersed in a 5% to 30% solution of nitric acid for one to sixty seconds in order to strip off Zn. Then they are immersed in a zincate bath again for one second to two minutes in order to precipitate fine Zn particles on the Al surfaces. Subsequently, they are immersed in an electroless Ni plating bath in order to provide Ni plating.

The plating is provided to a thickness of about 2 to 10 μm. The plating bath includes hypophosphorous acid as a reducer. Its pH is 4 to 5, and temperature is set at 80 to 95 degrees Celsius.

In this process, the bathing in hypophosphorous acid results in a coprecipitate of phosphorous (P). Plated metals grow isotropically from the coupling terminal (TFT coupling part) 14 of the wiring substrate 10 and from the coupling terminal 61 of the TFT 13. Therefore, the two terminals are joined by the plated metals that have grown at the both terminals 14 and 61 to reach half the gap between the two terminals. In order to increase a joined area, the plating is carried on for a while after they are joined.

When all the terminals 14 and 61 are coupled, they are immersed in a displacement Au plating bath so as to plate the Ni surface with Au. Au plating is formed to a thickness of about 0.05 μm to 0.3 μm. The Au bath is cyanide-free. Its pH is 6 to 8, and temperature is at 50 to 80 degrees Celsius. The immersing in the bath is for one to thirty minutes. In this way, an Ni—Au plating bumps are formed on each coupling terminal 14 and 61.

Figure 5B:
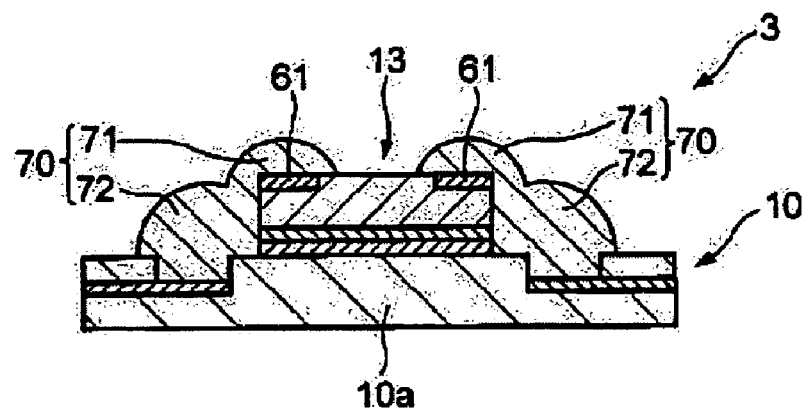
Figure 7B:
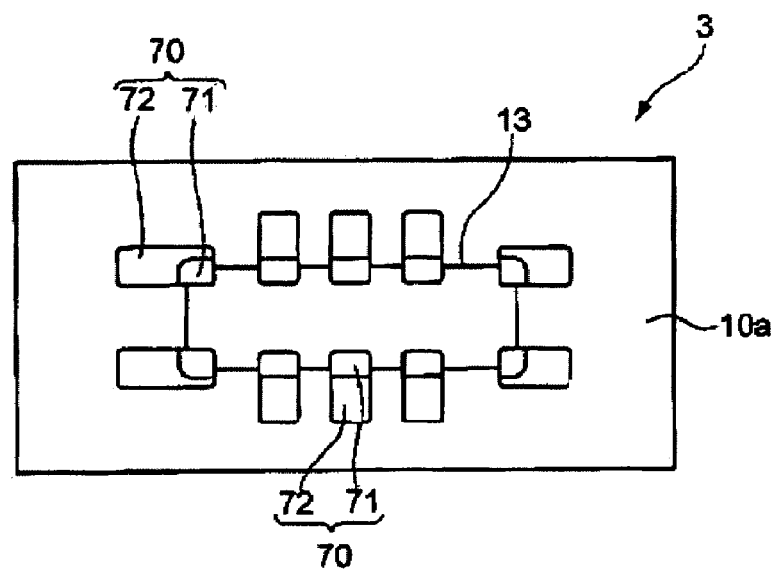

Thus, as shown in FIGS. 5B and 7B, the both coupling terminals 14 and 61 are electrically coupled to each other by bumps 71 and 72 that have grown by electroless plating. As a result, the semiconductor substrate 3 including the TFT 13 mounted on the wiring substrate 10 is completed.

In the present embodiment, after the TFT 13 is transferred to the wiring substrate 10 in a way that the both terminals 14 and 61 face upwardly, the terminals 14 and 61 facing upwardly are electrically coupled to each other by electroless plating. Therefore, it is easy to check the coupling in an appearance test, stylus test, or the like. Moreover, even if contact failure occurs, it is easy to solve the problem since the coupling parts face upwardly together and are easily accessible.

A process for manufacturing the organic EL substrate to be joined face to face with the semiconductor substrate 3 will now be described. Here, a known method for manufacturing an organic EL substrate can be used. More specifically, the anode 122, the cathode separator 126, the hole injection/transport layer 123, the organic EL element 124, and the cathode 125 are provided on the transparent substrate 120 as shown in FIG. 1 to provide the organic EL substrate 4.

A step for joining the semiconductor substrate 3 and the organic EL substrate 4 to provide the electro-optical device 1 shown in FIG. 1 will now be described.

First, the organic EL coupling part 15 made of a conductive material is provided on the semiconductor substrate 3. On the organic EL coupling part 15, the conductive paste 31 made of a silver paste is provided.

Next the semiconductor substrate 3 and the organic EL substrate 4 are joined in a way that the cathode 125 included in the organic EL substrate 4 comes in contact with the conductive paste 31 provided to the semiconductor substrate 3. In joining the two substrates, the sealing paste 30 is sealed in between the both substrates. Furthermore, a sealant 32 seals around the both substrates.

Through the above-described processes, the electro-optical device 1 shown in FIG. 1 is completed.

The electro-optical device 1 is a top-emission organic EL device, having the cathode 125, the organic EL element 124, the injection/transport layer 123, and the anode 122 arranged in this order in the organic EL substrate 4 from the semiconductor substrate 3 side, in which emitted light is taken out from the anode 122 side.

Note that the embodiment described above is not intended to limit the present invention. For example, while electroless plating is used for both of the coupling parts or terminals 14 and 61 to electrically couple the terminals 14 and 61 in the present embodiment, electroless plating may be conducted for either the terminal 14 or 61 in order to deposit plating for joining on either of the two. In this case, either the terminal 14 or 61 can be made of a material that is hard or impossible to deposit plating. Examples of materials of the terminals 14, 61 here include conductive metal materials such as Al and Cu, and nitride films such as TiN.

Figure 8A:
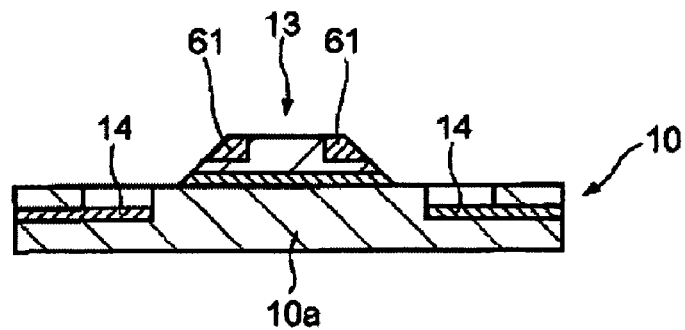
FIGS. 8(A-B) comprise sectional views showing a modification of the structure of a semiconductor element.
Figure 8B:
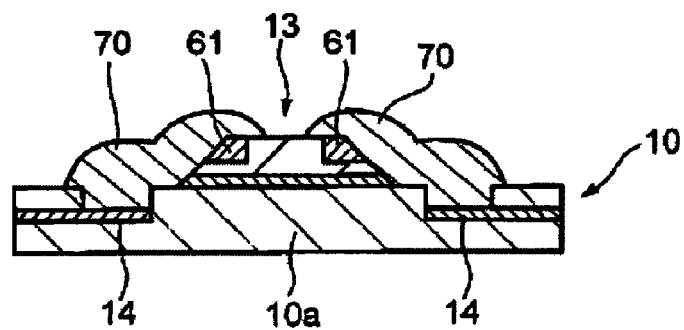

Also, in order to facilitate the plated coupling of the terminals 14 and 61, the TFT 13 may have a tapered cross section as shown in FIG. 8A. If the TFT 13 has a shape spreading toward the wiring substrate 10, it becomes easy for a plating 70 to join the terminals 14 and 61 despite a step between the two as shown in FIG. 8B, and thereby providing further reliable electrical coupling.

Figure 9:
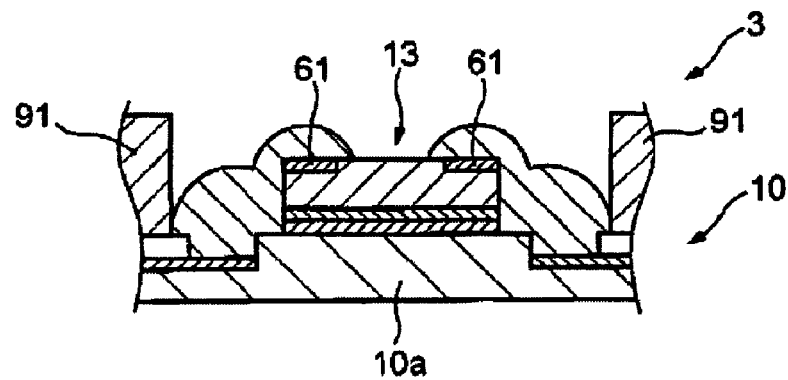
FIG. 9 is a sectional view showing the structure of an insulating wall.

Since the plating grows isotropically in a mushroom shape, an insulating wall 91 shown in FIG. 9 may be provided if the pitch between the terminals 14 of the wiring substrate 10 is narrow or if it is necessary to deposit a large amount of plating to fill a large gap between the terminals 14 and 61.

Figure 10:
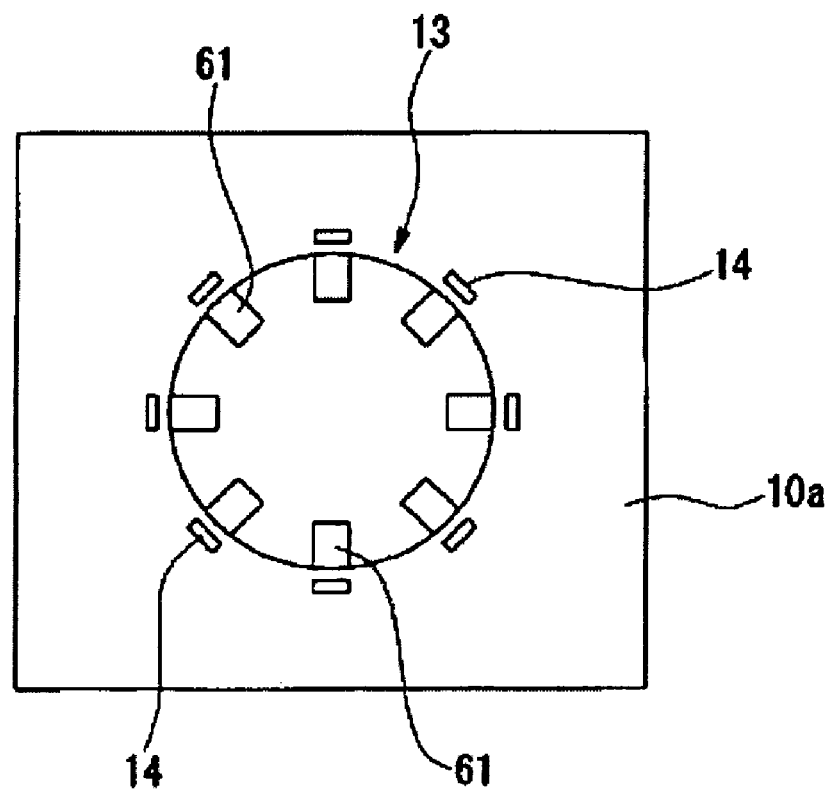
FIG. 10 is a plan view showing a modification of the structure of a semiconductor element.

Furthermore, while the TFT (chip) 13 used in the present embodiment is rectangular, the TFT (chip) 13 may be circular, for example, as shown in FIG. 10. In this case as well, the terminals 14 and 61 face upwardly so that the terminals 14 and 61 can be electrically coupled to each other by electroless plating. By using such a circular TFT (chip), the adhesive 51 extends isotropically, and it is possible to effectively prevent the adhesive 51 from leaking from the joined area.

What is claimed is:

1. A method for manufacturing a semiconductor substrate including a semiconductor element mounted on a wiring substrate, comprising:
    forming the wiring substrate including a wiring-side terminal on a surface of a first substrate;
    forming an element substrate by providing the semiconductor element including an element-side terminal to a second substrate so as to dispose the element-side terminal face to face with a surface of the second substrate;
    joining the wiring substrate with the element substrate by disposing the surface of the first substrate on which the wiring-side terminal is provided face to face with the surface of the second substrate on which the semiconductor element is provided in a way that the wiring-side terminal is disposed outside the semiconductor element in a substrate plane;
    separating the second substrate from the semiconductor element after joining the wiring substrate with the element substrate; and
    electrically coupling the element-side terminal that has been exposed by separating the second substrate to the wiring-side terminal disposed outside the semiconductor element by electroless plating.

2. The method for manufacturing a semiconductor substrate according to claim 1, wherein forming the wiring substrate includes forming a group of terminals composed of a plurality of wiring-side terminals, and
    joining the wiring substrate with the element substrate includes applying an adhesive to an in-plane area serving as a joining area that is inside the group of terminals so as to join the wiring substrate with the element substrate by means of the adhesive.

3. The method for manufacturing a semiconductor substrate according to claim 1, wherein electrically coupling the terminals to each other is conducted by making plating grow from both the wiring-side terminal and the element-side terminal.

4. The method for manufacturing a semiconductor substrate according to claim 1, further comprising:
    before electrically coupling the terminals to each other, providing an insulating wall outside the wiring-side terminal disposed around the semiconductor element so as to restrain plating from extending outward.

5. A method for manufacturing an electro-optical device including a switching element for driving a light-emitting element mounted on a wiring substrate, comprising:
    the method for manufacturing a semiconductor substrate according to claim 1 so as to mount the semiconductor element as the switching element on the wiring substrate.

6. A method of making an electrical device comprising:
    a.) forming a wiring substrate having a plurality of terminals surrounding an area and facing an upper surface of the substrate;
    b.) temporarily securing an electrical component to a surface of a carrier substrate, said component having a first face and a second face with terminals thereon, the second face being adjacent the surface of the carrier substrate;
    c.) positioning the carrier substrate relative to the wiring substrate so that the first face of the component contacts said area of the wiring substrate;
    d.) transferring the component from the carrier substrate to the wiring substrate, the terminals on the component and the terminals on the wiring substrate mutually facing in the same direction and being spaced from each other; and
    e.) forming a metallization layer from the terminals on the component to the terminals on the wiring layer to electrically connect them together; and
    wherein step e.) is performed by electroless plating.

7. The method of claim 6 wherein step b.) is performed by securing the component with an adhesive and wherein step d.) is performed by subjecting the adhesive to a treatment that sufficiently reduces its adhesive strength to permit the carrier substrate to be lifted away from the component.

8. The method of claim 7 wherein the treatment comprises irradiating the adhesive with laser light.

9. The method of claim 8 wherein the component is a thin film transistor (TFT) and wherein the method further comprises:
    mounting an electroluminescent (EL) substrate to the wiring substrate; and
    electrically connecting the TFT on the wiring substrate to the EL substrate through a conductive path including the terminals on the component, the metallization layer and the terminals on the wiring layer.

* * * * *